Feb. 8, 1966 R. EMEIS 3,233,309

METHOD OF PRODUCING ELECTRICALLY ASYMMETRICAL SEMICONDUCTOR DEVICE OF SYMMETRICAL MECHANICAL DESIGN

Filed July 11, 1962 3 Sheets-Sheet 1

United States Patent Office 3,233,309
Patented Feb. 8, 1966

3,233,309

METHOD OF PRODUCING ELECTRICALLY ASYMMETRICAL SEMICONDUCTOR DEVICE OF SYMMETRICAL MECHANICAL DESIGN

Reimer Emeis, Ebermannstadt, Germany, assignor to Siemens-Schuckertwerke Aktiengesellschaft, Berlin-Siemensstadt, Germany, a corporation of Germany Filed July 11, 1962, Ser. No. 208,988
Claims priority, application Germany, July 14, 1961, S 74,813
7 Claims. (Cl. 29—155.5)

My invention relates to the production of electrically asymmetrical semiconductor devices having a substantially symmetrical mechanical construction.

In a more particular aspect, my invention relates to a method of producing electrically asymmetrical semiconductor devices by furnishing the two flat sides of a flat, disc-shaped semiconductor body with respective alloy electrodes, for example of gold or aluminum, and then fusing a compensator or carrier plate to one of the electrodes, the carrier plate being at least as large as the alloy area that bonds the electrode to the semiconductor body and possesses a thermal coefficient of expansion which does not excessively depart from that of the semiconductor material, being at most twice as large as the coefficient of the semiconducting rectifier proper. Suitable as such compensating or carrier plates in conjunction with semiconductor bodies of germanium or silicon are such metals as molybdenum, tungsten and chromium. A method of the type just mentioned is described in the German published patent application DAS 1,018,557. Semiconductor devices made according to this method are electricall asymmetrical but are to a great extent symmetrical with respect to mechanical design.

It is an object of my invention to provide a different way of producing semiconductor devices generally of the above-mentioned type for the purpose of obviating certain deficiencies of the above-described method that heretofore limited the attainable electrical qualities of such devices. More specifically, therefore, it is an object of my invention to improve the electrical qualities of semiconductor devices of this type. A still more specific object is to afford and facilitate subjecting the semiconductor member proper to quality improving treatment before completing its assemblage with the relatively large compensator or carrier plates which, once bonded to the semiconductor element, render it virtually inaccessible to such treatment.

According to my invention I produce an electrically asymmetrical semiconductor device of substantially symmetrical mechanical design by first producing a semiconductor element according to known alloying principles so that this element or member constitutes a subassembly for further fabrication. This subassembly is composed of a disc-shaped semiconductor plate of monocrystalline substance such as germanium or silicon, which has an alloy-bonded carrier plate, preferably of molybdenum, on one flat side, whereas the other flat side of the semiconductor body carries an electrode consisting of a gold-semiconductor eutectic. After completing the preparation of this subassembly, a second carrier plate, which may also consist of molybdenum and which is coated at least on one flat side thereof with a layer of silver, is placed upon the gold-semiconductor eutectic electrode so that the eutectic alloy and the silver layer are in face-to-face contact with each other. The entire assembly thus prepared is then kept under compressing pressure for several hours and simultaneously is kept heated to an elevated temperature below the melting point of the gold-semiconductor eutectic. The pressure being applied during the heating period should be sufficient to reliably maintain an intimate contact between the silver surface and the surface of the gold alloy and may amount from about 200 to about 400 kg./cm.$^2$, although somewhat lower as well as higher pressures can also be applied. A processing period of about three hours is needed, whereas an extension beyond a period of ten hours may result in inferior products particularly at temperatures near the upper range. The technically preferred temperature limits have been found to be at about 200 and about 300° C.

The method according to the invention has the advantage that the subassembly, composed of a semiconductor body with the alloyed carrier plate and the electrodes alloyed into the semiconductor material, is accessible to any desired further modes of treatment prior to attaching the second carrier plate. For example, the subassembly can be subjected to etching or other purifying or material-removing surface treatments, so that a considerably improved quality of the resulting product can be obtained.

The foregoing and further objects, advantages and features of the invention will be apparent from, and will be described in, the following with reference to an embodiment of the method and of the resulting product illustrated by way of example in the accompanying drawing, in which.

Figure 2:
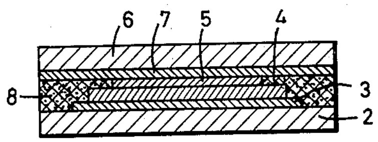
FIG. 2 is a sectional view of a semiconductor device produced by the method of the present invention after assembly.
Figure 3:
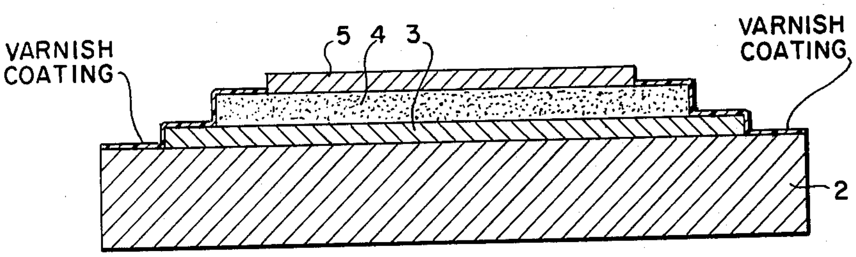
FIG. 3 is a sectional view of the semiconductor device produced by the method of the present invention showing the varnish coating on the semiconductor subassembly.
Figure 4:
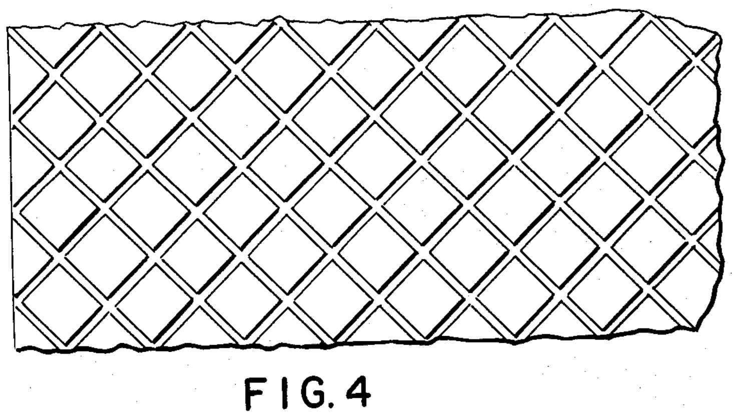
FIG. 4 is a plan view of a portion of the silver member of the semiconductor device produced by the method of the present invention showing the relief pattern formed thereon.
Figure 5:
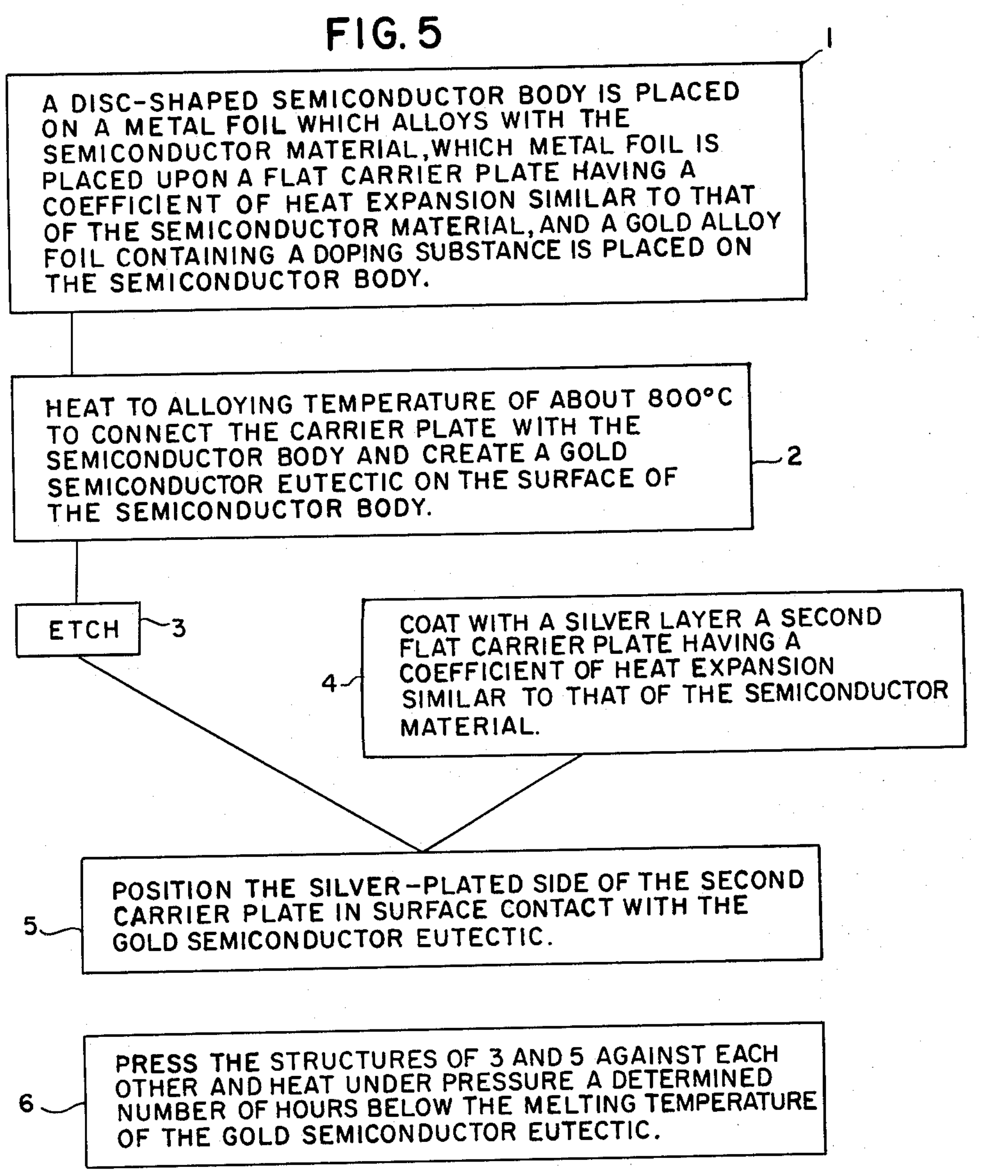
FIG. 5 is a flow sheet for the method of the present invention.

When producing the device according to FIG. 2, two subassemblies are prepared separately, namely a semiconductor subassembly comprising the components 2, 3, 4, 5 and a separate carrier plate 6 to be provided with a silver layer 7. The semiconductor subassembly, formed by a carrief plate 2, a semiconductor body 4 and electrodes 3 and 5 alloyed together with the semiconductor material, is produced for example in the following manner.

Placed upon a molybdenum disc 2 of circular shape and about 22 mm. diameter is an aluminum disc 3 of about 19 mm. diameter. Placed upon the aluminum disc is a plate 4 of p-type monocrystalline silicon having a specific resistance of about 1000 ohm-cm. and a diameter of about 18 mm. Thereupon, a gold-antimony foil 5 of smaller diameter, for example 14 mm., than the silicon disc is put on top of the semiconductor disc. The subassembly is embedded into a powder of a material that does not react with the above-mentioned substances and does not melt at the processing temperature. Suitable as such powder is graphite. While the embedded subassembly is kept under pressure in the graphite embedment, it is heated together with the graphite powder to a temperature of about 800° C. by maintaining sufficient pressure to secure fusion and alloying between the individual parts of the subassembly. The heating is preferably effected in an alloying furnace which is evacuated or filled with protective gas. The result is shown in FIG. 1 and consists of the above-described carrier plate 2 joined by an aluminum alloy 3 with the semiconductor disc 4 which in turn has an alloyed electrode 5 on top.

Figure 1:
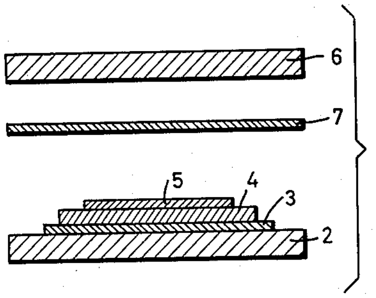
FIG. 1 is a sectional view of a semiconductor device produced by the method of the present invention prior to assembly.

The second carrier plate 6 shown in FIG. 1 has the same area size and preferably also the same thickness as the carrier plate 2. The second carrier plate 6 may also consist of molybdenum for example. A silver foil 7, for example of 0.1 mm. thickness, is placed upon the flat side of the carrier plate 6 facing the gold-semiconductor eutectic alloy 5. The foil 7 is fastened to the plate 6 by rolling or by soldering.

After the two subassemblies mentioned above are prepared, the carrier plate 6 is pressed with its silver layer or coating 7 against the gold alloy electrode 5. Suitable for the materials and sizes here described is a pressure of about 300 kg./cm.$^2$, although it will be understood that a higher or lower pressure, departing for example by about 50 kg./cm.$^2$ in the upward or downward direction may also be employed. At a pressure of about 300 kg./cm.$^2$ a heating period of several hours, for example 5 hours, suffices for gaining satisfactory fusion at a temperature below the melting point of the gold-semiconductor eutectic. Preferably employed in conjunction with the above-mentioned pressure of 300 kg./cm.$^2$ and treating duration of about 5 hours is a temperature of about 250° C.

I have found it preferable to subject the mutually contacting surfaces of the silver layer 7 and the gold-semiconductor eutectic 5 to lapping in order to give them accurate planar shape before assembling the device. When applying this precaution, the above-described application of pressure and heat reliably results in a firm bonding of the silver layer to the gold alloy by diffusion or sintering. The pressure, temperature and duration of the heating process can be varied within relatively wide limits. This is due to the fact that a diffusion of silver into the gold-semiconductor eutectic, or the diffusion of gold into the silver, requires a smaller amount of time at higher temperatures and, conversely, will still take place to a sufficient extent at lower temperatures if the process is continued for a sufficient length of time. As mentioned, the technologically preferred range of processing temperatures has been found to be about 200 to about 300° C. At lower temperatures the heating treatment becomes excessively long or exhibits insufficient results. At higher temperatures it may happen that due to lowering of the melting point on account of the applied pressure, a melting of the gold-semiconductor eutectic at a few localities may take place. Such melting is detrimental to the desired high qualities of the product. The melting point of the gold-silicon eutectic is at about 370° C., the melting point of gold-germanium eutectic at about 360° C.

The subassembly comprising the parts 2 to 5 according to FIG. 1 can be subjected to any desired treatment prior to assembling it with the components 6 and 7. For example, the surface of the semiconductor material of body 4 left vacant by the electrode alloy 5 and by the carrier plate 2 can be subjected to etching. Such etching is advantageously performed on a so-called etching centrifuge on which the subassembly is rotated about its symmetry axis while a jet of etching liquid is directed onto the semiconductor surface. Subsequently, a jet of neutralizing or diluting liquid, for example distilled water, is applied in the same manner for terminating the etching attack sufficiently rapidly to prevent other parts, particularly the carrier plate 2, from being attacked by the etching liquid. In this manner the effect of the etching liquid can be accurately concentrated upon the semiconductor surfaces to be treated thereby.

After etching, the semiconductor surface thus treated can be coated with a protective varnish. Suitable for this purpose is a silicone varnish containing an addition of alizarin.

The etching operation described above has also the result that the top surface of the gold-semiconductor eutectic 5, which origninally protrudes slightly over the semiconductor surface, becomes still farther spaced from the top plane of the semiconductor surface. For that reason a breakdown of the air space between the silver layer 7 and the aluminum layer 3 can be reliably prevented, particularly if the semiconductor surface is subsequently coated with insulating varnish, as described above. It has been found advantageous to fill the annular groove between the two carrier plates 2 and 6 (FIG. 2) with insulating material, preferably with casting resin 8 after the semiconductor device is otherwise completed in the manner described above. As a result, the semiconductor body 4 is securely protected from mechanical and other damage, and the mechanical construction of the entire design is reinforced.

I have found it particularly advantageous to provide the silver coating 7 on the second carrier plate 6 with a relief pattern, for example a waffle pattern, of mutually intersecting lines, before lapping the surface of the silver coating. The braced portions of the pattern are then made planar by the lapping operation. The lower portions of the pattern, after the silver layer 7 is pressed together with the eutectic 5, form a fine system of channels which becomes filled with casting resin when subsequently such resin is poured into the annular hollow space between the two carrier plates. The casting can also be used for contributing appreciably to the heat transfer between the two carrier plates, particularly if a filler agent for example quartz dust or meal is added to the casting resin.

It will be seen from FIG. 2 that a device made according to the invention is completely symmetrical in mechanical respects as far as its exterior design is concerned. Consequently such an electrically asymmetrical semiconductor device possesses the further advantage that, for the production of encapsulated rectifiers, such as described, for example in my copending application Serial No. 209,047, rectifiers of respectively different forward direction but the same external design can be produced in a particularly simple manner. By virtue of the fact that the mechanical design is completely symmetrical, it is only necessary to place the rectifier device according to FIG. 2 upon the bottom of the encapsulating housing so that either its carrier plate 6 or its carrier plate 2 is in contact with the housing bottom. In the first case the resulting encapsulated device has one poling and in the other case it has the opposite poling.

If desired, the carrier plates 2 and 6 can be coated with silver on their external sides so that they can be more readily soldered to a cooling body or other heat sink or to current supply terminals or conductors. However, if desired, the semiconductor devices may be fastened within a housing only by mechanical area pressure between two pressure parts that also serve as current supply means, as is more fully described in my above-mentioned copending application.

Such and other modifications will be obvious to those skilled in the art from a study of this disclosure and are indicative of the fact that my invention can be given embodiments other than particularly illustrated herein, without departing from the essential features of my invention and within the scope of the claims annexed hereto.

For further details of preparing the subassembly comprising elements 2, 3, 4 and 5, reference may be had to my Patent No. 2,960,419.

My copending application Serial No. 209,047 claiming a German priority of July 12, 1961, is based upon my German application No. S 74,774 VIIIc/21g of that date.

I claim:

1. The method of producing an electrically asymmetrical semiconductor device of substantially symmetrical mechanical design which comprises the steps of producing a semiconductor subassembly from a monocrystalline semiconductor plate with an alloy-bonded carrier metal plate having a thermal coefficient of expansion substantially similar to that of the semiconductor plate on one side thereof and an alloyed gold-semiconductor eutectic alloy electrode on the opposite side; covering a second carrier metal plate having a thermal coefficient of expansion substantially similar to that of the semiconductor plate on at least one flat side with a layer of silver; placing the silver-covered side of the second carrier plate into face-to-face contact with the gold alloy electrode; and subjecting the entire assembly for several hours to a pressure of between about 200 kg./cm.$^2$ to about 400 kg./cm.$^2$ and simultaneous heating to a temperature of about 200° C. to 300° C.

2. The method of producing an electrically asymmetrical semiconductor device of substantially symmetrical mechanical design which comprises the steps of producing a semiconductor subassembly from a monocrystalline semiconductor plate with an alloy-bonded carrier plate comprising metal selected from the group consisting of molybdenum, tungsten and chromium on one side thereof and an alloyed gold-semiconductor eutectic alloy electrode on the opposite side; placing a flat member of silver upon one flat side of a second carrier plate comprising metal selected from the group consisting of molybdenum, tungsten and chromium; forming a relief pattern of contact points in said silver member on its side facing away from said second carrier plate; placing the silver covered side of the second carrier plate into face-to-face contact with the gold alloy electrode; and pressing the second carrier plate against said subassembly for several hours at a pressure between about 200 and about 400 kg./cm.$^2$ and simultaneously heating the entire assembly to a temperature of about 200 to about 300° C.

3. The method of producing an electrically asymmetrical semiconductor device of substantially symmetrical mechanical design which comprises the steps of producing a semiconductor subassembly from a monocrystalline semiconductor plate with an alloy-bonded carrier plate comprising metal selected from the group consisting of molybdenum, tungsten and chromium on one side thereof and an alloyed gold-semiconductor eutectic alloy electrode on the opposite side; coating a second carrier plate comprising metal selected from the group consisting of molybdenum, tungsten and chromium on at least one flat side thereof with silver; lapping the respective surfaces of the silver coating and of the gold alloy electrode to planar shape and thereafter placing them in face-to-face contact with each other; and heating the entire assembly to a temperature of about 200 to about 300° C. for a period of more than three hours while maintaining said surfaces in pressure contact of between about 200 kg./cm.$^2$ to about 400 kg./cm.$^2$ with each other.

4. In the method according to claim 1, the step of etching said semiconductor subassembly prior to placing its gold-alloy electrode in contact with the silver layer of the second carrier plate.

5. In the method according to claim 4, the etching being applied only to the one flat side of said semi-conductor plate on which said gold-alloy electrode is located.

6. In the method according to claim 1, the step of etching said semiconductor subassembly at least on the electrode-carrying side thereof, and coating the etched surface with varnish prior to placing the electrode in contact with the silver layer of the second carrier plate.

7. The method according to claim 1, comprising the further step of filling a casting resin into the interstice between said two carrier plates and the semiconductor surface left vacant by the gold-alloy electrode.

References Cited by the Examiner

UNITED STATES PATENTS

| | | | |
|---|---|---|---|
| 2,660,697 | 11/1953 | Lauckner | 317—241 |
| 2,763,822 | 9/1956 | Frola et al. | 317—240 |
| 2,794,942 | 6/1957 | Cooper | 317—235 |
| 2,897,419 | 7/1959 | Howland et al. | 317—234 |
| 2,930,950 | 3/1960 | Teszner | 317—234 |
| 2,960,419 | 11/1960 | Emeis | 148—1.5 |
| 2,964,830 | 12/1960 | Henkels et al. | 317—240 |
| 2,994,627 | 8/1961 | Roka | 148—184 |
| 3,006,067 | 10/1961 | Anderson et al. | 317—235 X |
| 3,014,819 | 12/1961 | Hunter | 148—184 |
| 3,028,663 | 4/1962 | Iwersen et al. | 317—235 X |
| 3,047,780 | 7/1962 | Metz | 317—234 |

JOHN W. HUCKERT, *Primary Examiner.*

JAMES D. KALLAM, DAVID J. GALVIN, *Examiners.*

A. M. LESNIAK, *Assistant Examiner.*